United States Patent [19]

Aoki

[11] 4,209,715
[45] Jun. 24, 1980

[54] LOGIC CIRCUIT

[75] Inventor: Kiyoshi Aoki, Yokohama, Japan

[73] Assignee: Tokyo Shibaura Electric Co., Ltd., Kawasaki, Japan

[21] Appl. No.: 859,139

[22] Filed: Dec. 9, 1977

[30] Foreign Application Priority Data

Dec. 14, 1976 [JP] Japan .................................. 51-150197
Dec. 14, 1976 [JP] Japan .................................. 51-150198

[51] Int. Cl.$^2$ ..................... H03K 3/286; H03K 19/08; H03K 19/20; H03K 21/00
[52] U.S. Cl. .................................. 307/291; 307/213; 307/215; 307/220 R; 307/225 R; 328/39; 357/92
[58] Field of Search ........... 307/203, 213, 215, 220 R, 307/225 R, 289, 291; 328/39; 357/92

[56] References Cited

U.S. PATENT DOCUMENTS

| | | | |
|---|---|---|---|
| 3,467,839 | 9/1969 | Miller | 307/203 X |
| 3,541,356 | 11/1970 | Lagemann | 307/289 |
| 3,588,546 | 6/1971 | Lagemann | 307/215 X |
| 3,609,569 | 9/1971 | Todd | 307/291 X |
| 3,947,865 | 3/1976 | Russell | 357/92 X |
| 3,989,957 | 11/1976 | Tuccu | 357/92 X |
| 4,002,933 | 1/1977 | Leuschner | 307/291 |
| 4,037,085 | 7/1977 | Minorikawa | 307/220 R X |
| 4,056,736 | 11/1977 | Blatt | 307/289 |
| 4,056,810 | 11/1977 | Hart et al. | 357/92 X |

FOREIGN PATENT DOCUMENTS

| | | | |
|---|---|---|---|
| 1230460 | 12/1966 | Fed. Rep. of Germany | 307/220 R |
| 2326110 | 1/1974 | Fed. Rep. of Germany | 307/220 R |
| 2455125 | 5/1976 | Fed. Rep. of Germany | 307/225 R |
| 49-35030 | 9/1974 | Japan . | |

OTHER PUBLICATIONS

Hart et al., *Electronics* (pub.); pp. 111–118, 10/3/1974.
Grebenyuk et al., "High-Speed Triggers with a Counting Input which are Based on Integrated Circuits"; *1975 Plenum Publishing Corp.* pp. 448–449.
Pedersen, "Integrated Injection Logic: A Bipolar LSI Technique"; *Computer* (pub.); vol. 9, No. 2, pp. 24–29; Feb. 1976.
Berger et al., "Advanced Merged Transistor Logic by Using Schottky Junctions"; *Microelectronics* (pub.); vol. 7, No. 3, 1976; pp. 35–42.

*Primary Examiner*—Larry N. Anagnos
*Attorney, Agent, or Firm*—Frishauf, Holtz, Goodman and Woodward

[57] ABSTRACT

A logic circuit comprises four NAND or NOR gates. The first and second gates are cross-coupled and the third and fourth gates are also cross-coupled. The outputs of the first and second gates are coupled to the inputs of the third and fourth gates respectively. Complementary clock pulses are respectively supplied to the first and second gates and the third and fourth gates, and first and second logic inputs are applied to the inputs of the first and second gates, respectively.

15 Claims, 30 Drawing Figures

F I G. 1
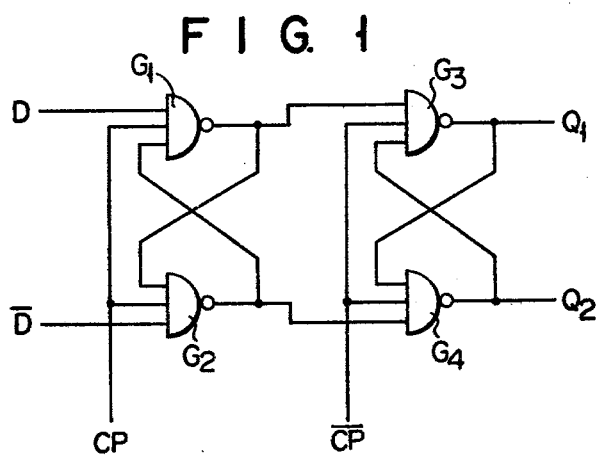
F I G. 2
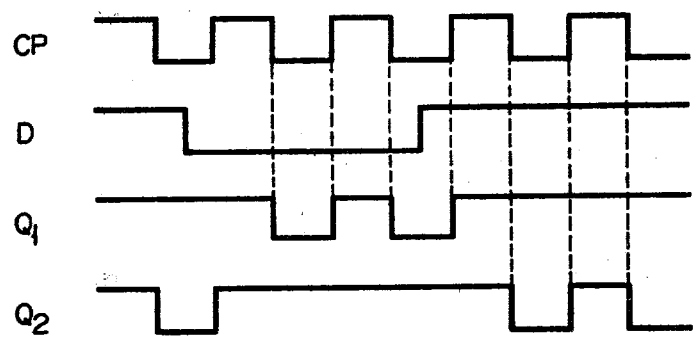
F I G. 3
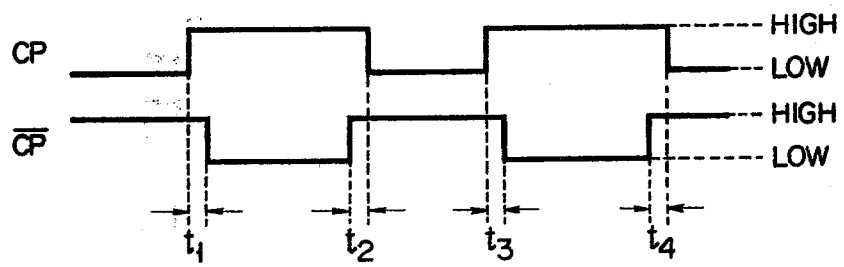

LOGIC CIRCUIT

BACKGROUND OF THE INVENTION

This invention relates to a logic circuit, and more particularly to a logic circuit suitable for use with integrated-injection logic ($I^2L$) gates.

Hitherto, a logic circuit such as a D-type flip-flop circuit and frequency divider or binary counter for generating an output signal having half the frequency of clock pulses supplied thereto generally comprises six or eight logic gates (NAND/NOR gates). Application of as few logic gates as possible is desired to elevate the integration density of an integrated logic circuit, decrease power consumption and ensure high speed operation.

SUMMARY OF THE INVENTION

It is accordingly the object of this invention to provide a logic circuit capable of performing a desired logic operation by means of fewer logic gates than required for the prior art.

A logic circuit of this invention comprises first to fourth integrated-injection logic NAND/NOR gates, each having inputs and outputs. The first and second NAND/NOR gates are cross-coupled with respect to first inputs and first outputs thereof. The third and fourth NAND/NOR gates are also cross-coupled with respect to first inputs and first outputs thereof. The first and second NAND/NOR gates have respective second inputs thereof connected to receive a first clock signal and third respective inputs thereof connected to receive first and second logic input signals. The third and fourth NAND/NOR gates have respective second inputs connected to receive a second clock signal substantially opposite in phase to the first clock signal, and respective third inputs connected to second outputs of the first and second NAND/NOR gates. At least one integrated-injection logic inversion gate is used to provide one of the first and second clock signals. Two or more integrated-injection logic inversion gates may be used to provide the first and second clock signals. If, in this case, a current output capability of that output of a preceeding inversion gate which is connected to an input of a succeeding inversion gate providing one of the first and second clock signals is made larger than that of other output of the preceding gate providing the other clock signal, then a delay time of the clock signal provided by the succeeding inversion gate is effectively reduced.

BRIEF DESCRIPTION OF THE DRAWINGS

FIG. 1 shows a logic circuit according to one embodiment of this invention;

FIG. 2 is a timing chart of the logic circuit of FIG. 1;

FIG. 3 illustrates the waveform of a clock pulse which may be used with the logic circuit of FIG. 1;

DETAILED DESCRIPTION OF THE PREFERRED EMBODIMENTS

The logic circuit of this invention is fundamentally comprised of four NAND or NOR gates. FIG. 1 shows a logic circuit according to one embodiment of this invention which comprises four NAND gates $G_1$ to $G_4$ for the positive logic system. For the negative logic system, however, the NAND gates $G_1$ to $G_4$ are replaced by NOR gates. The first and second NAND gates $G_1$ and $G_2$ are cross-coupled such that an output from either of the NAND gates $G_1$ and $G_2$ is fed back to the input of the other. The third and fourth NAND gates $G_3$ and $G_4$ are similarly cross-coupled. The outputs of the first and second NAND gates $G_1$ and $G_2$ are connected to the inputs of the third and fourth NAND gates $G_3$ and $G_4$. The inputs of the first and second NAND gates $G_1$ and $G_2$ are supplied with a first clock pulse CP. The inputs of the third and fourth NAND gates $G_3$ and $G_4$ are supplied with a second clock pulse $\overline{CP}$ having a substantially opposite phase to the first clock pulse CP. The inputs of the first and second NAND gates $G_1$ and $G_2$ are respectively supplied with complementary logic inputs D and $\overline{D}$.

FIG. 2 is a timing chart for the outputs $Q_1$ and $Q_2$ from the third and fourth gates $G_3$ and $G_4$ of the logic circuit of FIG. 2, the logic input D and the clock pulse CP.

Where the logic circuit of FIG. 1 is formed of CMOS or TTL, the periods of time $t_n (=t_1, t_2, t_3, t_4, \ldots)$ during which both clock pulses CP and $\overline{CP}$ shown in FIG. 3 are kept at a high voltage level should substantially satisfy the condition expressed by the following formula:

$$-\tfrac{1}{2}t_{pd} \leq t_n \leq 2t_{pd} \tag{1}$$

where $t_{pd}$ shows a propagation delay time per gate, and the minus notation denotes the period of time during which both clock pulses CP and $\overline{CP}$ remain at a low voltage level.

Where the logic circuit of FIG. 1 is formed of I²L gates, then the periods of time $t_n$ may satisfy the condition indicated by the following formula:

$$-2t_{pd} \leq t_n \leq 2t_{pd} \qquad (2)$$

Figure 4:
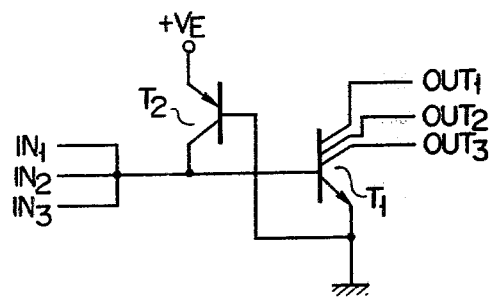
FIG. 4 shows an equivalent circuit of an integrated-injection logic ($I^2L$) gate.
Figure 5:
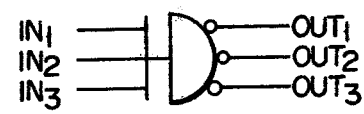
FIG. 5 indicates the logic symbol of the $I^2L$ gate of FIG. 4.

The I²L gate recently developed comprises, as shown in the equivalent circuit of FIG. 4, an inverter-type npn vertical transistor $T_1$ and a pnp lateral injector transistor $T_2$ whose base and collector are connected to the emitter and base of the transistor $T_1$ respectively. As seen from FIG. 4, three inputs $IN_1$, $IN_2$, $IN_3$ are coupled to the base of inverter transistor $T_1$ constructed as a multiple-collector transistor whose three collectors provide three outputs $OUT_1$, $OUT_2$, $OUT_3$. In this specification, such an I²L gate is represented by a logic symbol given in FIG. 5. Where this logic symbol is used for I²L gate, then the logic circuit of FIG. 1 may be illustrated as in FIG. 6.

The reason why the condition for the clock pulses to the I²L gate can be relieved as shown by the aforesaid formula (2) is that in the first place, the I²L gate has a threshold voltage biased to a high level side; and in the second place, at large current operation, the I²L gate has such a characteristic that a length of time required for an input potential to fall from a high to a low level is far longer than that which is required for the input potential to be increased from a low to a high level.

The gentle condition for the clock pulses to the I²L gates ensures not only the stable operation of a logic circuit but also the easy production of the clock pulses. For instance, generation of complementary clock pulses CP and $\overline{CP}$ for the CMOS gate needs two cascade-connected inverters and NAND gates connected to the input and output of the cascade connection of the inverters. In contrast, production of complementary clock pulses for the I²L gate requires only one inverter as shown in FIG. 7.

Figure 6:
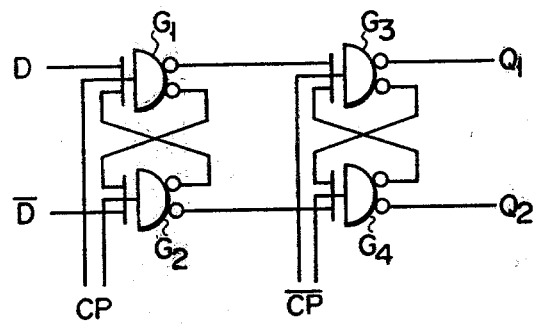
FIG. 6 shows the arrangement of the logic circuit of FIG. 1 formed of the $I^2L$ gates.
Figure 8:
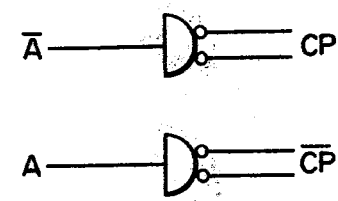
FIG. 8 shows another form of circuit for generating the clock pulse.
Figure 9:
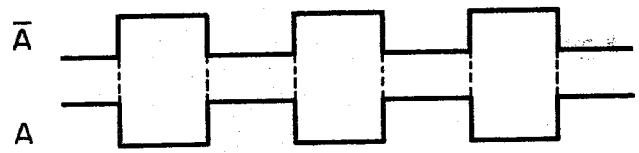
FIG. 9 shows the waveforms of input signals supplied to the circuit of FIG. 8.

For stable operation of the logic circuit of FIG. 6 at a high frequency, the time relationship between the clock pulses CP and $\overline{CP}$ constitutes an important factor. When clock pulses CP and $\overline{CP}$ are sent forth through the gates indicated in FIG. 8, then the logic circuit can be most stably operated at a high frequency if input signals A and $\overline{A}$ have a 50% duty cycle and exactly opposite phases as illustrated in FIG. 9. The I²L gates are useful for production of clock pulses to control a delay time of clock pulses being produced. The delay time of clock pulses is determined by the relationship between the positions of the collector of the inverter transistor and the emitter of the injector transistor, and resistance occurring across the base electrode of the inverter transistor and the collector region thereof. Where it is desired to shorten the delay time of a pulse, it is advised to dispose the collector of the inverter transistor as close as possible to the emitter of the injector transistor and reduce the resistance across the collector and the base electrode of the inverter transistor. To further shorten the delay time, it is also possible to connect two collectors of the inverter transistor in parallel, thereby doubling the output current capability.

Figure 7:
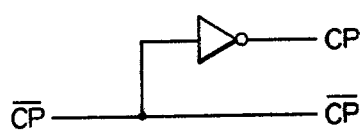
FIG. 7 shows a fundamental circuit for producing clock pulses supplied to the $I^2L$ gate.
Figure 10:
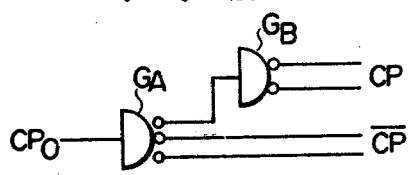
FIGS. 10 to 16 illustrate other circuits for issuing the clock pulses.
Figure 11:
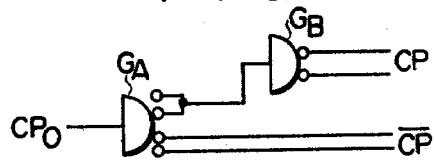
Figure 12:
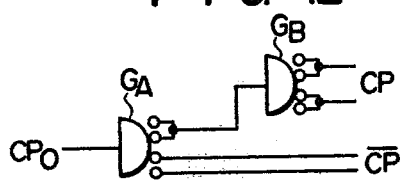
Figure 13:
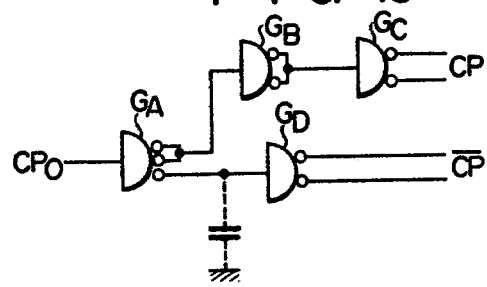

FIG. 10 represents the case where a basic circuit of FIG. 7 for producing the clock pulses CP and $\overline{CP}$ is realized by I²L gates GA and GB. The circuit of FIG. 10 is suitable for use with large current. FIG. 11 shows the case where input to the I²L gate GB is supplied from parallel-connected collectors of the I²L gate GA, thereby decreasing the propagation delay time of I²L gate GB. FIG. 12 indicates the case where a clock pulse CP is derived from the parallel-connected collectors of the I²L gate GB. The circuits of FIGS. 10, 11 and 12 are all suitable for high frequency operation. In FIG. 13, I²L gates GD and GC are respectively connected to the output terminals of the I²L gates GA and GB. The circuit of FIG. 13 is so arranged that an injector current of the I²L gate GD is smaller than that of the I²L gate GB to make longer a length of time required for the input potential of the I²L gate GD to increase from a low to a high level than that of the I²L gate GB. Alternatively, to this end, it is possible to provide a capacitance at the input of the I²L gate GD. The circuit of FIG. 13 is suitable for use with both large and small currents from a low frequency to a high frequency.

Figure 14:
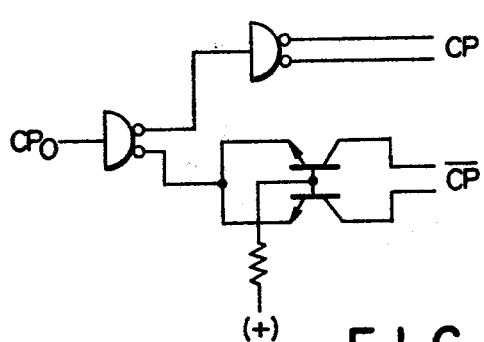
Figure 15:
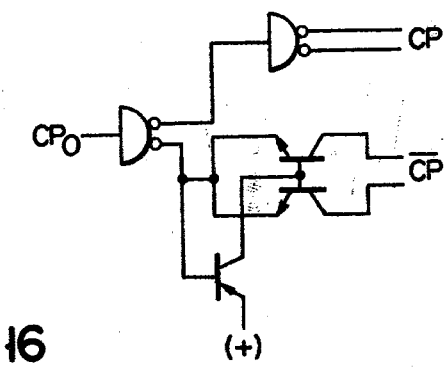
Figure 16:
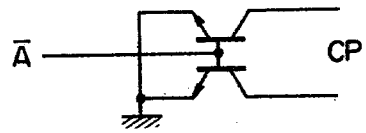
Figure 16:
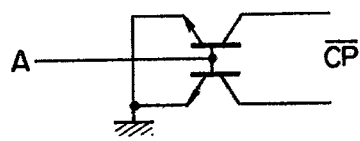

FIGS. 14 and 15 show the case where linear gates may advisably be provided in part of a circuit for producing clock pulses CP and $\overline{CP}$. To cause the linear gate to have the same delay time as the I²L gate, it is preferred to constitute a linear gate transistor by a vertical transistor whose emitter is formed of a semiconductor substrate. The circuit of FIG. 16 generates clock pulses only through the linear gates and is also suitable for high frequency operation.

Figure 19:
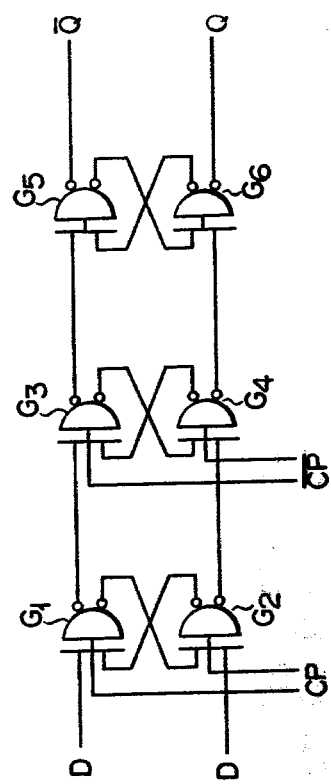
FIGS. 19 to 21 indicate logic circuits according to still other embodiments of the invention.
Figure 20:
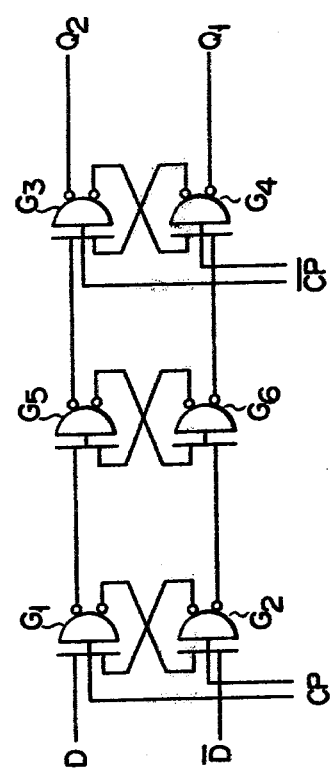
Figure 17:
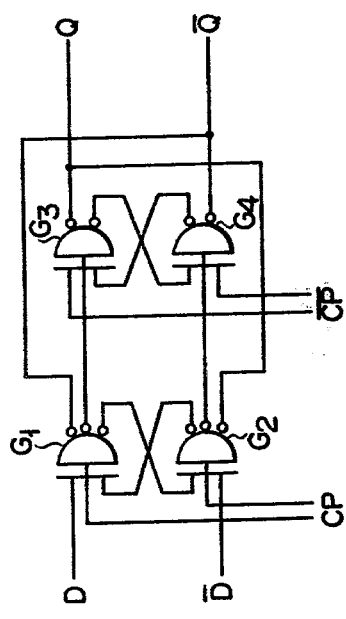
FIG. 17 is a modification of FIG. 6 for producing complementary outputs.
Figure 18:
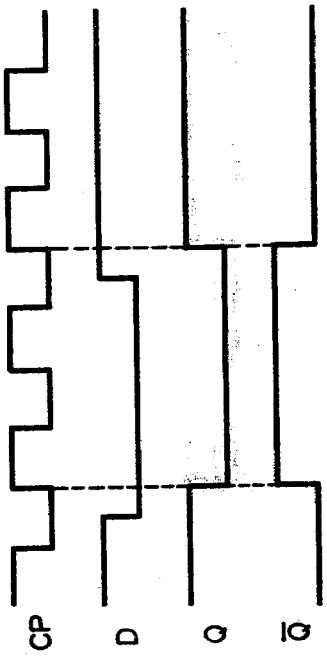
FIG. 18 is a timing chart of the circuit of FIG. 17.

With the embodiments of FIGS. 1 and 6, complementary outputs are not provided. Where, as shown in FIG. 17, the outputs of the first and second NAND gates $G_1$ and $G_2$ are connected to the outputs of the fourth and third NAND gates $G_4$ and $G_3$ respectively, then complementary outputs Q and $\overline{Q}$ are produced as shown in FIG. 18. For generation of the complementary outputs Q and $\overline{Q}$, it is possible to connect the outputs of the third and fourth NAND gates $G_3$ and $G_4$ to a latch circuit comprised of fifth and sixth cross-coupled NAND gates $G_5$ and $G_6$ as shown in FIG. 19. When, as shown in FIG. 20, the latch circuit is connected between the first and second NAND gates $G_1$ and $G_2$ and the third and fourth NAND gates $G_3$ and $G_4$, then the output $Q_1$ is issued from the fourth gate $G_4$ and the output $Q_2$ from the third gate $G_3$ in a reverse relationship from the case of FIG. 6. A clock pulse $\overline{CP}$ supplied to the NAND gates $G_3$ and $G_4$ may be replaced, as shown in FIG. 22, by outputs from the first and second NAND gates $G_1$ and $G_2$.

Figure 23:
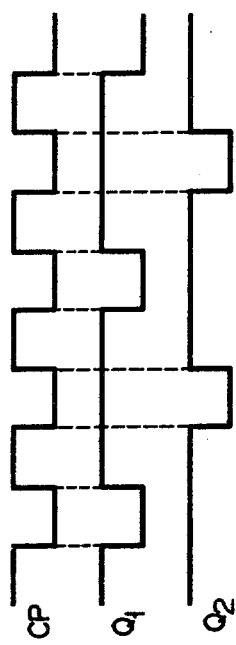
FIG. 23 is a timing chart of the frequency divider of FIG. 22.
Figure 24:
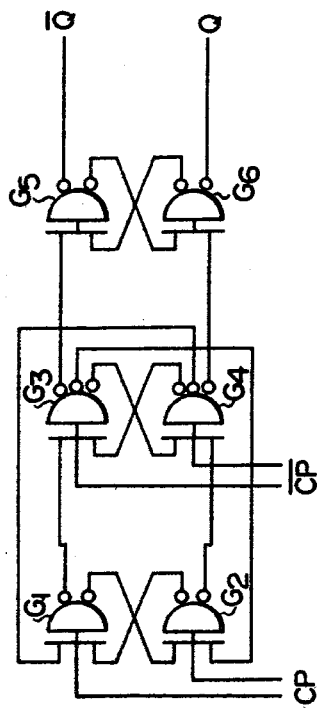
FIG. 24 shows the circuit of the frequency divider of FIG. 22 comprising the $I^2L$ gates, the circuit being connected to a latch circuit to generate complementary outputs.
Figure 22:
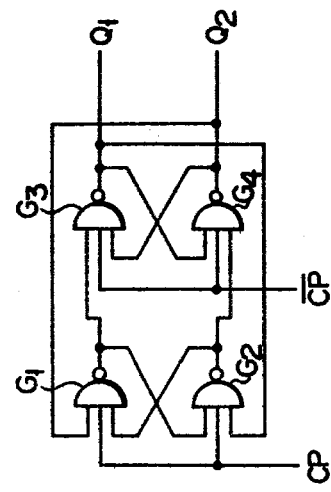
FIG. 22 is a frequency divider embodying the invention.

When, as shown in FIG. 22, outputs of the fourth and third NAND gates $G_4$ and $G_3$ are coupled to the logical inputs of the first and second NAND gates $G_1$ and $G_2$, then frequency division takes place as seen from the timing chart of FIG. 23. A frequency divider of FIG. 22 is arranged by the I²L gates as illustrated in FIG. 24. For production of complementary outputs Q and $\overline{Q}$, cross-coupled NAND gates $G_5$ and $G_6$ may be connected, as shown in FIG. 24, to the outputs of the third and fourth NAND gates $G_3$ and $G_4$.

Figure 25:
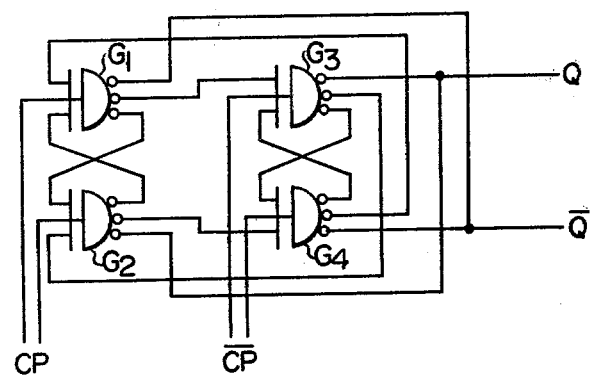
FIG. 25 indicates the arrangement of a binary counter according to the invention which uses the $I^2L$ gates.
Figure 26:
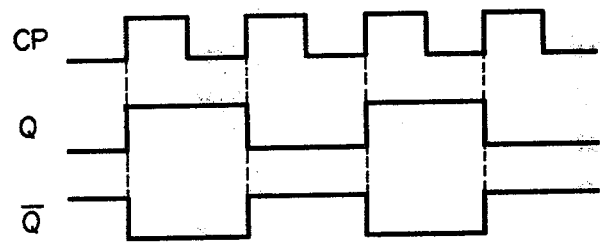
FIG. 26 is a timing chart of the binary counter of FIG. 25.

When, as indicated in FIG. 25, an output of the first NAND gate $G_1$ is connected to an output of the fourth NAND gate $G_4$, and an output of the second NAND gate $G_2$ is connected to an output of the third NAND gate $G_3$, then the circuit of FIG. 25 acts as a binary counter as seen from the timing chart of FIG. 26.

Figure 21:
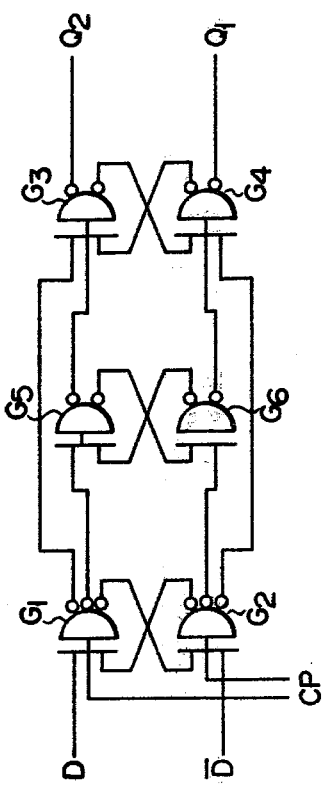
Figure 27:
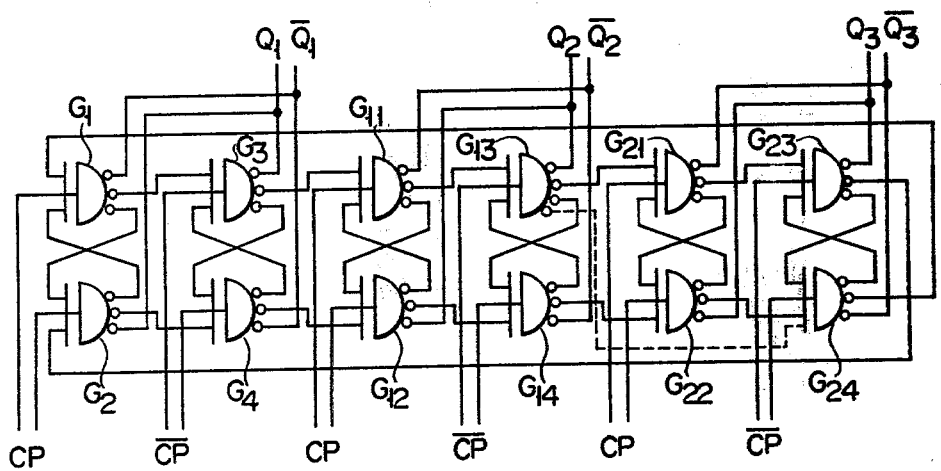
FIG. 27 illustrates a synchronous modulo-5 counter using the binary counter of FIG. 25.
Figure 30:
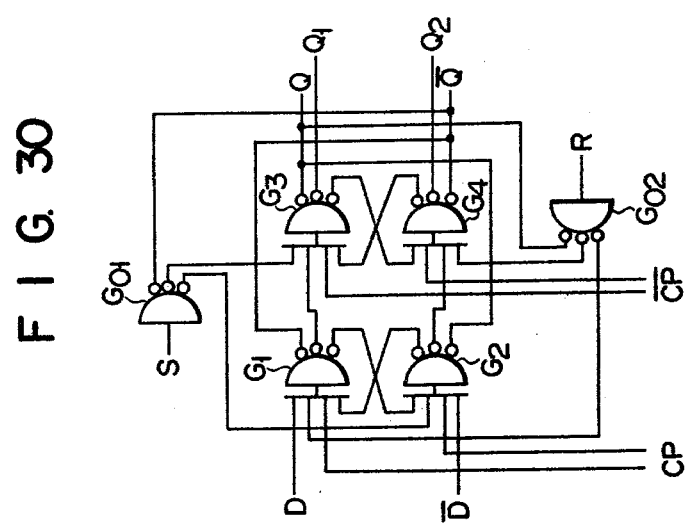
FIG. 30 illustrates a logic circuit according to the invention which has setting and resetting functions.
Figure 28:
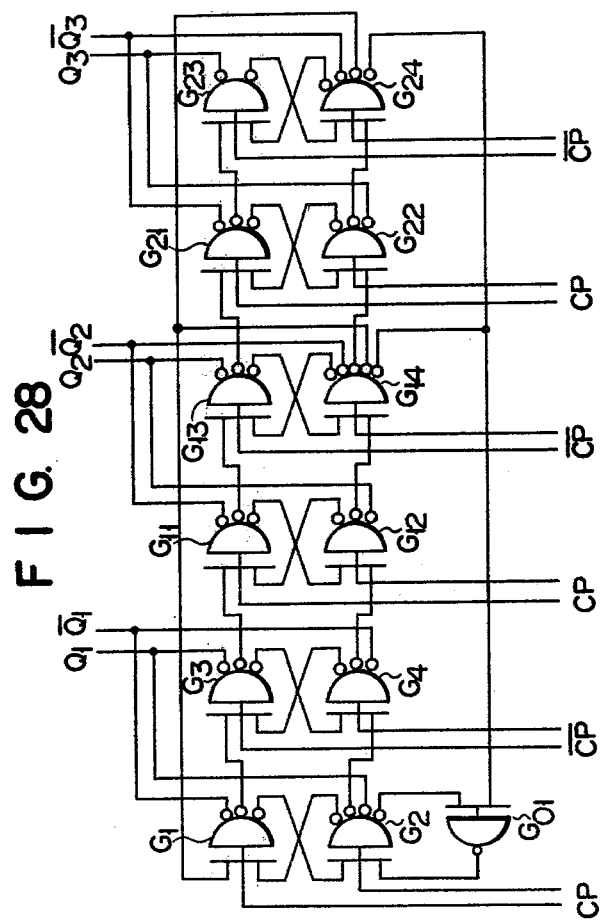
FIG. 28 is a modification of the synchronous modulo-5 counter of FIG. 27.
Figure 29:
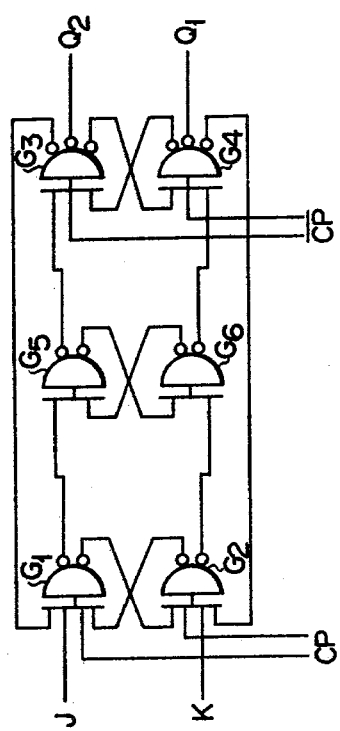
FIG. 29 shows a circuit arranged according to the invention to act as a J-K flip-flop circuit.

The logic circuit of this invention may be used as not only a binary counter, but also as many other types of counters. When, as shown in FIG. 27, three logic circuits are cascade-connected, outputs of the third and fourth NAND gates $G_{23}$ and $G_{24}$ of the third stage are respectively fed back to the inputs of the second and first NAND gates $G_2$ and $G_1$ of the first stage, then the circuit of FIG. 27 acts as a modulo-6 synchronous counter. When, under this condition, an output of the third NAND gate $G_{13}$ of the second stage is connected to an input of the fourth NAND gate $G_{24}$ of the third stage, then the circuit of FIG. 27 is converted into a modulo-5 counter. A modulo-5 counter may be arranged as shown in FIG. 28. Further, when a plurality of logic circuits of FIG. 25 are cascade-connected such that a succeeding logic circuit receives output pulses from the immediately preceding logic circuit, then it is possible to provide a ripple counter or asynchronous counter. The circuit of FIG. 19 may be used as a counter stage of a synchronous or asynchronous counter.

Where the logic circuit of this invention is arranged as shown in FIG. 29, then it is possible to provide, for example, a synchronous modulo-3 counter which functions like a J-K flip-flop circuit. In the circuit of FIG. 29, outputs of the third and fourth NAND gates $G_3$ and $G_4$ are respectively fed back to the inputs of the first and second NAND gates $G_1$ and $G_2$, and the first and second NAND gates $G_1$ and $G_2$ are supplied with J and K inputs respectively. As in the case of FIG. 21, clock pulses $\overline{CP}$ supplied to the third and fourth NAND gates $G_3$ and $G_4$ may be replaced by outputs of the first and second NAND gates $G_1$ and $G_2$.

It is possible to provide resetting and/or setting means to change an output state of the logic circuit of this invention. A set signal S is conducted through a gate $G_{01}$ to inputs of the second and third NAND gates $G_2$ and $G_3$ and the output of the fourth NAND gate $G_4$. A reset signal R is supplied through a gate $G_{02}$ to inputs of the first and fourth NAND gates $G_1$ and $G_4$ and the output of the third NAND gate $G_3$.

The logic circuit of this invention should preferably be formed of I²L gates, but may also be formed with other gates such as CMOS and TTL gates.

What is claimed is:

1. A logic circuit comprising:
   first and second integrated-injection logic NAND/NOR gates, each having a plurality of inputs and outputs, said first and second NAND/NOR gates being cross-coupled with respect to first inputs and first outputs thereof, said first NAND/NOR gate having second and third inputs connected to receive a first clock signal and a first logic input signal, respectively, and said second NAND/NOR gate having second and third inputs connected to receive said first clock signal and a second logic input signal, respectively, said first and second NAND/NOR gates having second outputs;
   third and fourth integrated-injection logic NAND/NOR gates, each having a plurality of inputs and outputs, said third and fourth NAND/NOR gates being cross-coupled with respect to first inputs and first outputs thereof, said third NAND/NOR gate having a second input connected to receive a second clock signal substantially complementary to said first clock signal and a third input connected to said second output of said first NAND/NOR gate, and said fourth NAND/NOR gate having a second input connected to receive said second clock signal and a third input connected to said second output of said second NAND/NOR gate; and
   clock means coupled to said NAND/NOR gates for supplying said first clock signal to said second inputs of said first and second NAND/NOR gates and for supplying said second clock signal to said second inputs of said third and fourth NAND/NOR gates, said clock means including:
      a first inverting gate comprised of a multiple-collector output transistor having a base input connected to receive a clock signal, and first, second and third collector outputs, said first and second collector outputs of said multiple-collector output transistor providing one of said first and second clock signals; and
      a second inverting gate having an input coupled to said third collector output of said multiple-collector output transistor of said first inverting gate, and first and second outputs providing the other of said first and second clock signals, said second inverting gate being an integrated-injection logic inverting gate.

2. The logic circuit according to claim 1 wherein said first inverting gate is an integrated-injection logic inverting gate.

3. The logic circuit according to claim 1 wherein said multiple-collector output transistor of said first inverting gate has a fourth collector output connected together with said third collector output to said input of said second inverting gate of said clock means.

4. The logic circuit according to claim 3, wherein the combined output current of said third and fourth collector outputs of said multiple-collector output transistor of said first inverting gate is larger than that of each of said first and second collector outputs thereof.

5. The logic circuit according to claim 3 wherein said second inverting gate of said clock means further includes third and fourth outputs connected together with said first and second outputs thereof, respectively.

6. The logic circuit according to claim 1 wherein said first and second NAND/NOR gates each have third outputs, and said third and fourth NAND/NOR gates have second outputs which are coupled to said third outputs of said second and first NAND/NOR gates, respectively.

7. The logic circuit according to claim 6 wherein said third and fourth NAND/NOR gates have third outputs which are coupled to said third inputs of said second and first NAND/NOR gates, respectively.

8. The logic circuit according to claim 1 wherein said third and fourth NAND/NOR gates have second outputs which are coupled to said third inputs of said second and first NAND/NOR gates, respectively.

9. The logic circuit according to claim 1 further comprising cross-coupled fifth and sixth integrated-injection logic NAND/NOR gates connected to outputs of said third and fourth NAND/NOR gates.

10. The logic circuit according to claim 1, further comprising cross-coupled fifth and sixth integrated-injection logic NAND/NOR gates connected between said second outputs of said first and second NAND/NOR gates and said third inputs of said third and fourth NAND/NOR gates.

11. A logic circuit comprising:
   first and second integrated-injection logic NAND/NOR gates, each having a plurality of inputs and outputs, said first and second NAND/NOR gates being cross-coupled with respect to first inputs and first outputs thereof, said first and second NAND/NOR gates each having a second input connected to receive a first clock signal, and a third input connected to receive first and second logic input signals, respectively, said first and second NAND/NOR gates each having second and third outputs; and third and fourth integrated-injection logic NAND/NOR gates, each having a plurality of inputs and outputs, said third and fourth NAND/NOR gates being cross-coupled with respect to first inputs and first outputs thereof, said third and fourth NAND/NOR gates having second inputs connected to said second outputs of said first and second NAND/NOR gates, respectively, third inputs connected to receive a second clock signal substantially complementary to said first clock signal, and second outputs connected to said third outputs of said second and first NAND/NOR gates, respectively.

12. A logic circuit comprising:

first and second integrated-injection logic NAND/NOR gates, each having a plurality of inputs and outputs, said first and second NAND/NOR gates being cross-coupled with respect to first inputs and first outputs thereof, said first and second NAND/NOR gates each having a second input which is connected to receive a first clock signal, said first and second NAND/NOR gates each having third inputs and second and third outputs; and third and fourth integrated-injection logic NAND/NOR gates, each having a plurality of inputs and outputs said third and fourth NAND/NOR gates being cross-coupled with respect to first inputs and first outputs thereof, said third and fourth NAND/NOR gates having second inputs connected to receive a second clock signal substantially complementary to said first clock signal, third inputs connected to said second outputs of said first and second NAND/NOR gates, respectively, second outputs connected to said third inputs of said second and first NAND/NOR gates, respectively, and third outputs connected to said third outputs of said second and first NAND/NOR gates, respectively.

13. A logic circuit comprising:

a plurality of cascade-connected stages, each stage including: first and second integrated-injection logic NAND/NOR gates, each having a plurality of inputs and outputs and being cross-coupled with respect to their first inputs and first outputs, second inputs of said first and second NAND/NOR gates being connected to receive a first clock signal; and third and fourth integrated-injection logic NAND/NOR gates, each having a plurality of inputs and outputs and being cross-coupled with respect to their first inputs and first outputs, said third and fourth NAND/NOR gates having second inputs connected to receive a second clock signal substantially complementary to said first clock signal, third inputs connected to second outputs of said first and second NAND/NOR gates, respectively, and second outputs connected to third inputs of said first and second NAND/NOR gates of an immediately succeeding stage; and means coupling second outputs of the third and fourth NAND/NOR gates of the final stage to third inputs of second and first NAND/NOR gates of the first stage, respectively.

14. The logic circuit according to claim 13 wherein said first, second, third and fourth NAND/NOR gates have third outputs, said third outputs being connected to said third outputs of said second and first NAND/NOR gates, respectively.

15. A logic circuit comprising:

first and second integrated-injection logic NAND/NOR gates, each having a plurality of inputs and outputs, said first and second NAND/NOR gates being cross-coupled with respect to first inputs and first outputs thereof, said first NAND/NOR gate having second and third inputs connected to receive a first clock signal and a first logic input signal, respectively, and said second NAND/NOR gate having second and third inputs connected to receive said first clock signal and a second logic input signal, respectively, said first and second NAND/NOR gates having second outputs;

third and fourth integrated-injection logic NAND/NOR gates, each having a plurality of inputs and outputs, said third and fourth NAND/NOR gates being cross-coupled with respect to first inputs and first outputs thereof, said third NAND/NOR gate having a second input connected to receive a second clock signal substantially complementary to said first clock signal and a third input connected to said second output of said first NAND/NOR gate, and said fourth NAND/NOR gate having a second input connected to receive said second clock signal and a third input connected to said second output of said second NAND/NOR gate; and clock means coupled to said NAND/NOR gates for supplying said first clock signal to said second inputs of said first and second NAND/NOR gates and for supplying said second clock signal to said second inputs of said third and fourth NAND/NOR gates, said clock means including:

a first integrated-injection logic inverting gate having an input connected to receive a clock signal, and first and second outputs;

a second integrated-injection logic inverting gate having an input connected to said first output of said first inverting gate, and first and second outputs providing one of said first and second clock signals;

a third integrated-injection logic inverting gate having an input connected to said second output of said first inverting gate, and a first output, and a fourth integrated-injection logic inverting gate having an input connected to said first output of said third inverting gate, and first and second outputs providing the other of said first and second clock signals, the time for an input potential of said second gate to change from a low level to a high level being longer than that of said third gate.

* * * * *